United States Patent [19]

Mofachern

[11] Patent Number: 5,014,229
[45] Date of Patent: May 7, 1991

[54] METHOD AND APPARATUS FOR CALIBRATING TRANSDUCER/AMPLIFIER SYSTEMS

[75] Inventor: Alexander Mofachern, Oakland, Calif.

[73] Assignee: Basic Measuring Instruments, Foster City, Calif.

[21] Appl. No.: 308,305

[22] Filed: Feb. 8, 1989

[51] Int. Cl.$^5$ .............................................. G01D 18/00
[52] U.S. Cl. ........................... 364/571.04; 364/571.07; 324/77 R; 73/1 R
[58] Field of Search ........... 364/550, 551.01, 572–576, 364/571.01, 571.03, 571.04, 571.07, 557, 484, 485, 487, 723, 724.10, 724.14, 726; 73/1 R, 1 B, 1 DV; 324/77 R, 77 G, 79 R; 374/1

[56] References Cited

U.S. PATENT DOCUMENTS

| Re. 31,750 | 11/1984 | Morrow | 364/550 X |
| 3,529,140 | 9/1970 | Doering | 364/572 X |
| 4,293,921 | 10/1981 | Smith, Jr. | 364/726 |
| 4,328,552 | 5/1982 | Stovall | 364/554 |
| 4,418,392 | 11/1983 | Hata | 364/571.07 |
| 4,633,422 | 12/1986 | Brauer | 364/571.07 |
| 4,811,264 | 3/1989 | Hershberger | 364/726 |
| 4,858,160 | 8/1989 | Strid et al. | 364/571.01 |
| 4,864,842 | 9/1989 | Regimand | 364/571.04 X |
| 4,912,468 | 3/1990 | Rust | 364/571.04 X |

OTHER PUBLICATIONS

Hewlett Packard, "Measurement-Computation-Systems", 1985, pp. 210–219 (Impedance Meters).
Nitz; "Self-Calibrating Technique Improves Power Monitor", *Design News*, pp. 141–146, May 20, 1989.

Primary Examiner—Joseph L. Dixon
Attorney, Agent, or Firm—Limbach, Limbach & Sutton

[57] ABSTRACT

The present invention improves the accuracy of waveshape measurements and transducers. Specifically, it is a method and apparatus which calibrates a system, which comprises transducers, amplifiers, filters and analog-to-digital converters, by digitally removing phase and amplitude errors over a frequency spectrum.

14 Claims, 7 Drawing Sheets

METHOD AND APPARATUS FOR CALIBRATING TRANSDUCER/AMPLIFIER SYSTEMS

FIELD OF THE INVENTION

This invention relates to the field of calibrating electronic measuring instruments and systems. More particularly, this invention relates to digital calibration of systems which may contain a transducer, an amplifier, a filter, or an analog-to-digital converter.

BACKGROUND OF THE INVENTION

Digital calibration methods and apparatus are known having means for removing amplitude errors in transducers, amplifiers, or analog-to-digital converters. FIG. 1A shows a prior art circuit, in which a physical value such as a temperature 10 that is to be measured is converted into an electric signal by a transducer 11. The signal level of the transducer may be increased by an amplifier 12, and unwanted signals and noise may be attenuated by a filter 13. The resulting analog signal is converted to a digital value by an analog-to-digital (A/D) converter 14. The output of the A/D converter 14 is read by a microprocessor system 16.

The microprocessor system 16 contains a stored calibration table 16'. As shown in FIG. 1B the calibration table 16' may be displayed as a graph of uncorrected amplitude readings 18 versus their associated corrected amplitude readings 19. If the transducer 11, amplifier 12, filter 13, and A/D converter 14 have no errors, the calibration graph will be the dashed straight line with unity slope 22. However, offset errors 17, gain errors 21, and non-linearity errors 20 caused by any element in the system are displayed as deviations from the dashed line 22. The microprocessor system 16 examines the uncorrected amplitude reading 15 provided by the A/D converter, then converts it to a corrected amplitude reading 17, typically by interpolation between points on the calibration graph.

It is sometimes the case that the physical value of interest is a waveform which is repetitive with respect to time, such as current waveforms in alternating current (AC) power systems. As with the steady state values described above the waveform can be distorted by the transducer 11, the amplifier 12, the filter 13, and the A/D converter 14.

Both the original waveform of the physical value and the distorted waveform resulting from the conversion process can be decomposed into a Fourier series of pure sine waves, with each sine wave having a unique frequency, amplitude and phase. At any frequency, the transducer, amplifier, filter, or A/D converter can introduce errors in the amplitude, phase shift or both, which can in turn introduce errors in the waveform stored in the microprocessor system.

These types of errors are illustrated in FIGS. 2, 3, 4 and 5. FIG. 2 shows a sample waveform of a physical value with respect to time, consisting of a fundamental frequency, its third harmonic, and its fifth harmonic. FIG. 3 shows the same waveform with the same harmonic amplitude content, but with substantial phase shift errors on the third harmonic and the fifth harmonic. FIG. 4 shows the waveform of FIG. 2 with both harmonic amplitude errors and phase shift errors. FIG. 5 shows the waveform of FIG. 2, with harmonic amplitude errors. It is clear by inspection that the waveforms in FIGS. 2 through 5 are different.

Because these errors to repetitive waveforms are frequency dependent, the prior art method and apparatus for digital calibration are incapable of correcting them. A method and apparatus are needed for calibrating systems which convert physical values having repetitive waveforms to an accurate digital value.

SUMMARY OF THE INVENTION

This invention is for a method and apparatus to digitally remove certain waveform errors introduced by transducers, amplifiers, filters, and A/D converters. Specifically, this invention is for a method and apparatus to digitally remove amplitude and phase shift errors across a frequency spectrum of interest.

The method of the present invention includes the step of storing a first plurality of amplitude to frequency correction tables and storing a second plurality of phase to frequency correction tables. A physical value is sensed, preferably by a transducer, and a measured signal is formed therefrom. The measured signal is converted to form an uncalibrated digital signal upon which a Fourier transform is performed to form a third plurality of uncalibrated frequency domain signals. Each of said frequency domain signals is compared to an appropriate one of the first plurality of amplitude to frequency correction tables and to one of said second plurality of phase to frequency correction tables to form a third plurality of calibrated frequency domain signals. A reverse Fourier transform is performed on the calibrated frequency domain signals to form a calibrated digital signal.

DETAILED DESCRIPTION OF THE PREFERRED EMBODIMENT

Figure 1A:
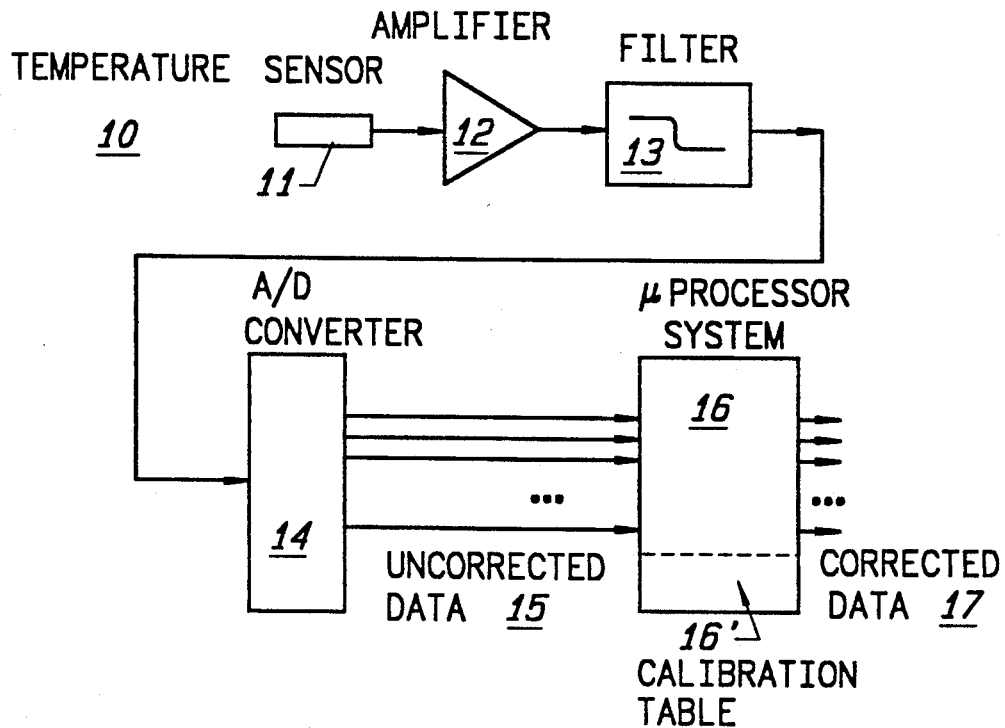
FIG. 1A shows a block diagram of a typical prior art measuring system with error correction.
Figure 1B:
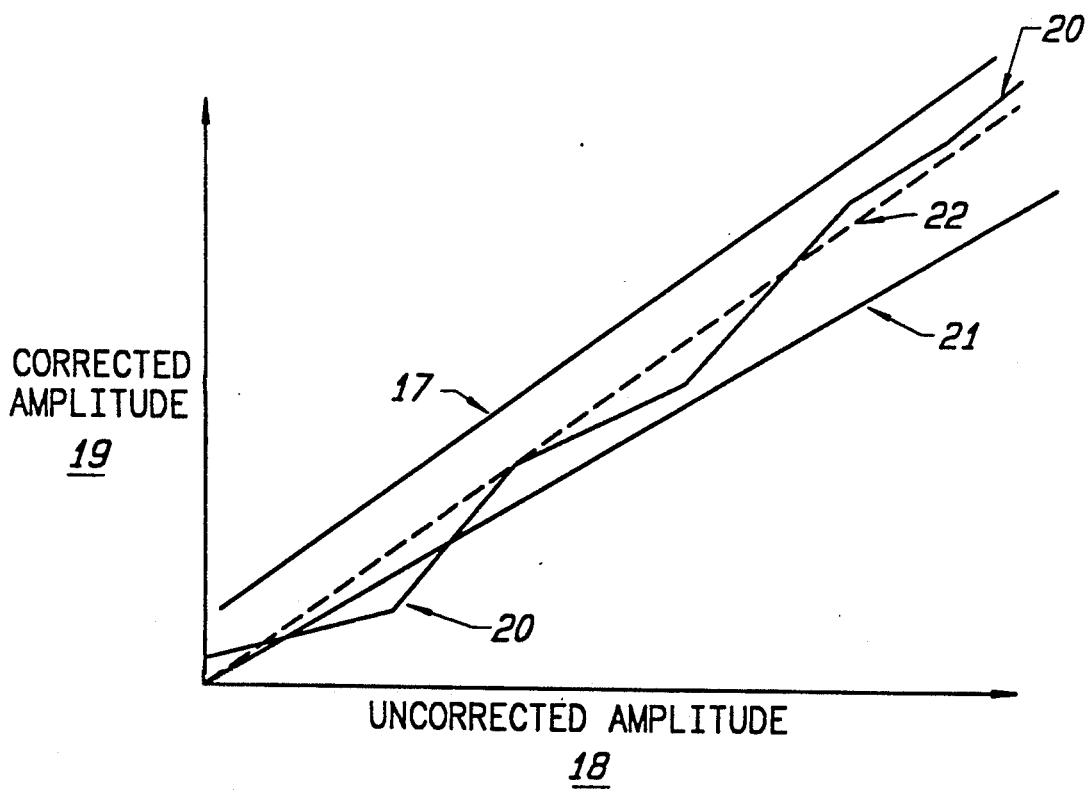
FIG. 1B shows a prior art graph representing a calibration table for correcting errors.
Figure 2:
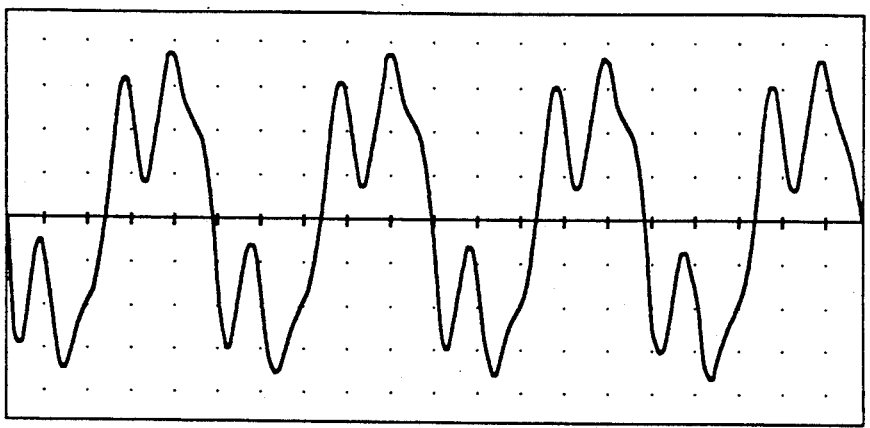
FIG. 2 shows a sample waveform of a physical value with respect to time.
Figure 3:
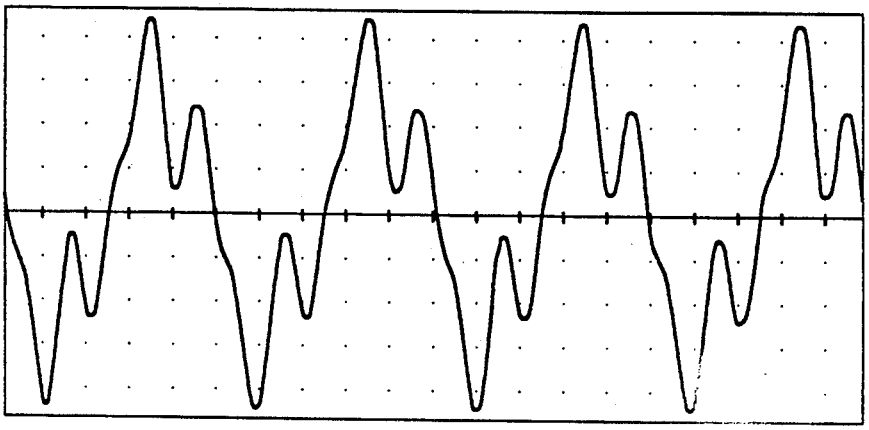
FIG. 3 shows the waveform of FIG. 2 having phase shift errors introduced in the harmonics.
Figure 4:
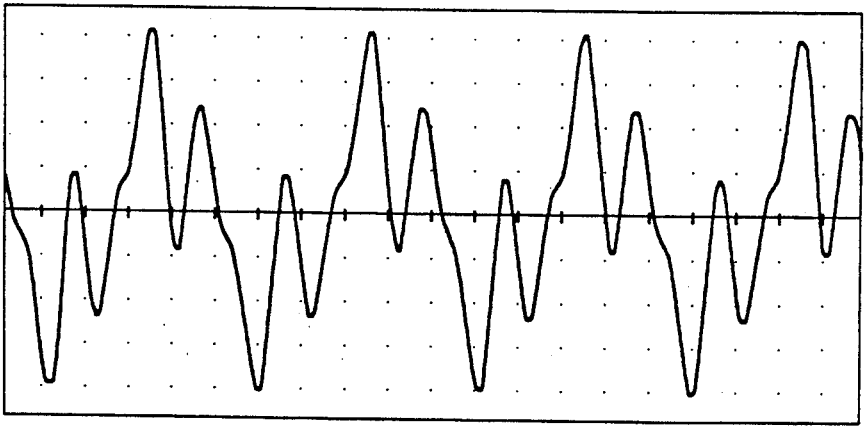
FIG. 4 shows the waveform of FIG. 2 having both phase shift errors and amplitude errors introduced in the harmonics.
Figure 5:
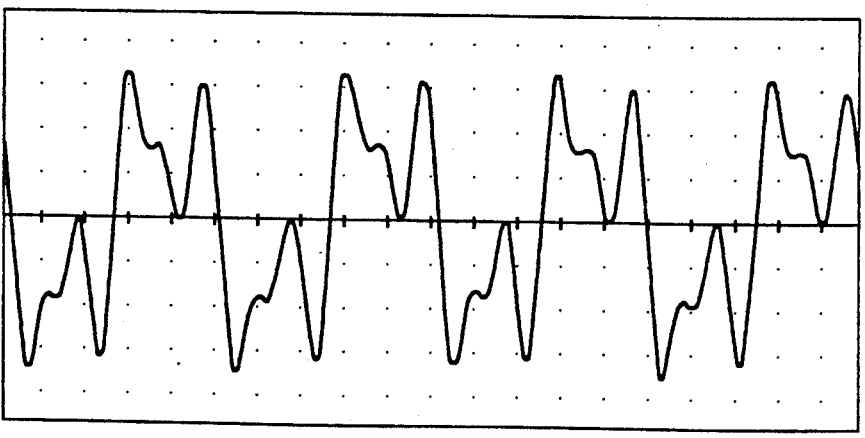
FIG. 5 shows the waveform FIG. 2 having amplitude errors introduced in the harmonics.
Figure 6A:
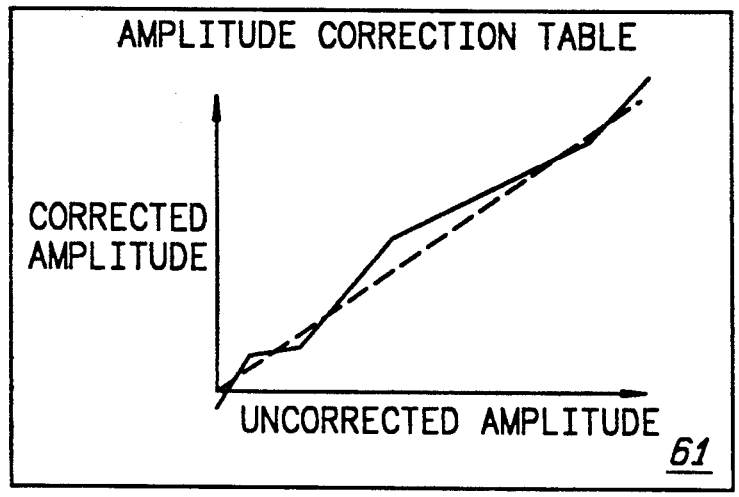
FIG. 6 shows a calibration correction table for amplitude and phase at a single frequency.
Figure 6B:
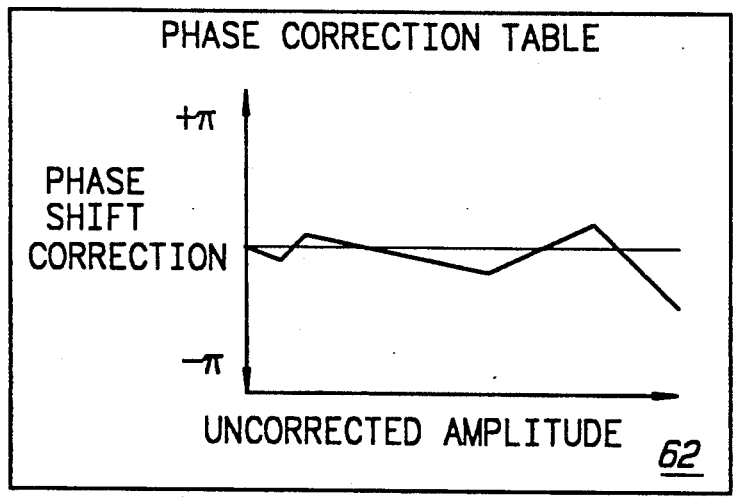
Figure 7A:
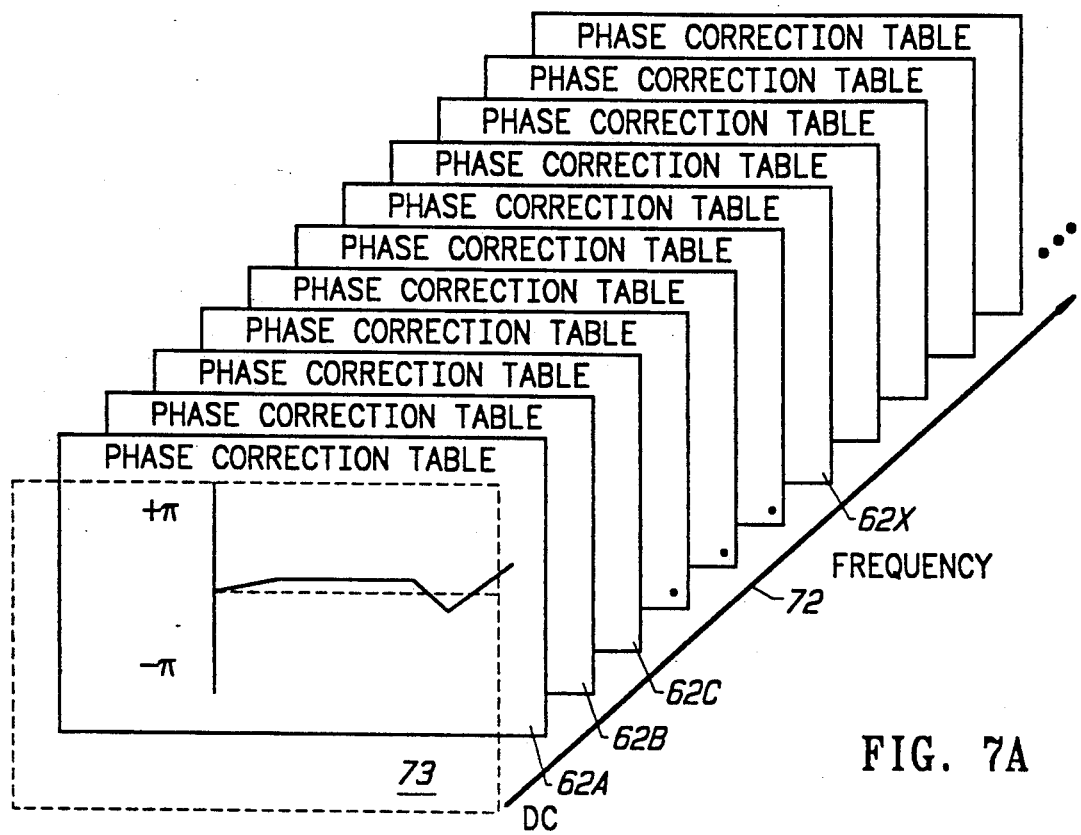
FIG. 7 shows a complete set of calibration correction tables for amplitude and phase over a range of frequencies.
Figure 7B:
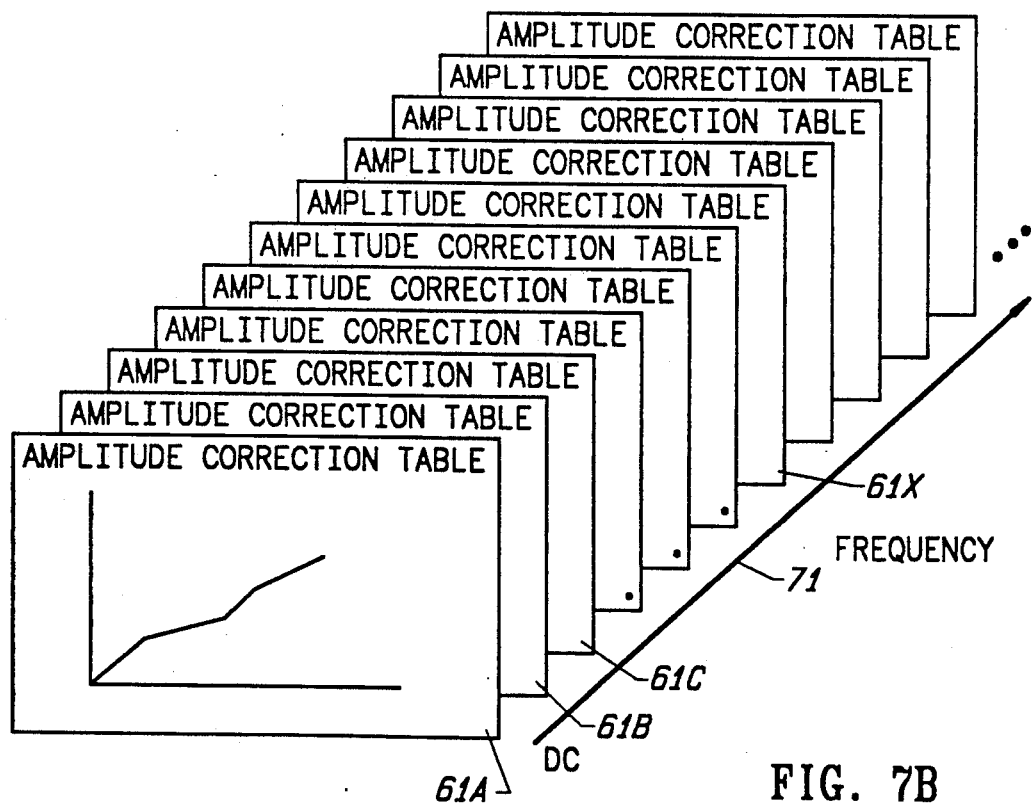

FIG. 6 shows a graph representing an Amplitude Correction Table 61 and a graph representing a Phase Correction Table 62, each for one unique frequency, which has been generated for the system to be calibrated according to the present invention. As is shown if FIG. 7, a plurality of these graphs or tables is needed, one for each of the frequencies in the range of interest, from DC to some upper limit. FIG. 7 shows the collection of Amplitude Correction Tables 71 and for a similar collection of frequencies for the Phase Correction Tables 72. A correction table for DC 73 is excluded from the Phase Correction Tables because phase shift has no meaning at DC. Each Amplitude Correction Table 61x contains pairs of points on a graph of Uncorrected Amplitude vs. Corrected Amplitude at an individual frequency. Each Phase Correction Table 62x contains pairs of points on a graph of Uncorrected Amplitude vs. Phase Shift Correction at an individual frequency. The number of pairs of points contained in each table is determined by the desired accuracy of the calibration, the rate of change of the described parameter, and the availability of digital storage.

Figure 8:
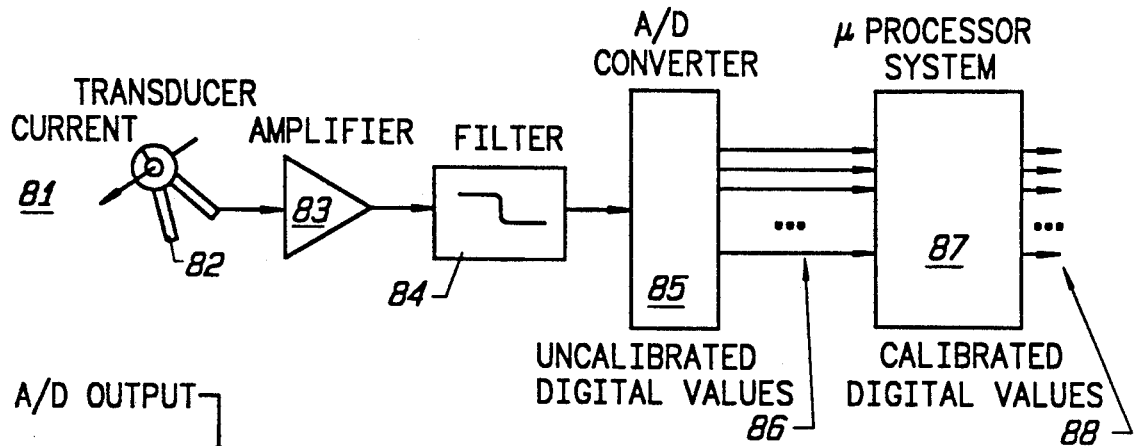
FIG. 8 shows a block diagram of an apparatus which implements the calibration correction tables shown in FIG. 7.

FIG. 8 shows a block diagram of a system to be calibrated according to the present invention. In the example of FIG. 8 a current 81 in a power supply system is transformed into a signal by a transducer 82. The signal formed by the transducer may be amplified by a amplifier circuit 83. Unwanted noise and extraneous signals may be removed by a filter circuit 84. The signal is then converted to a plurality of digital values by the A/D converter 85. The plurality of uncalibrated digital values 86 is supplied to a microprocessor system 87. The microprocessor system 87 operates on the uncalibrated digital values 86 to form a plurality calibrated digital values 87.

Figure 9:
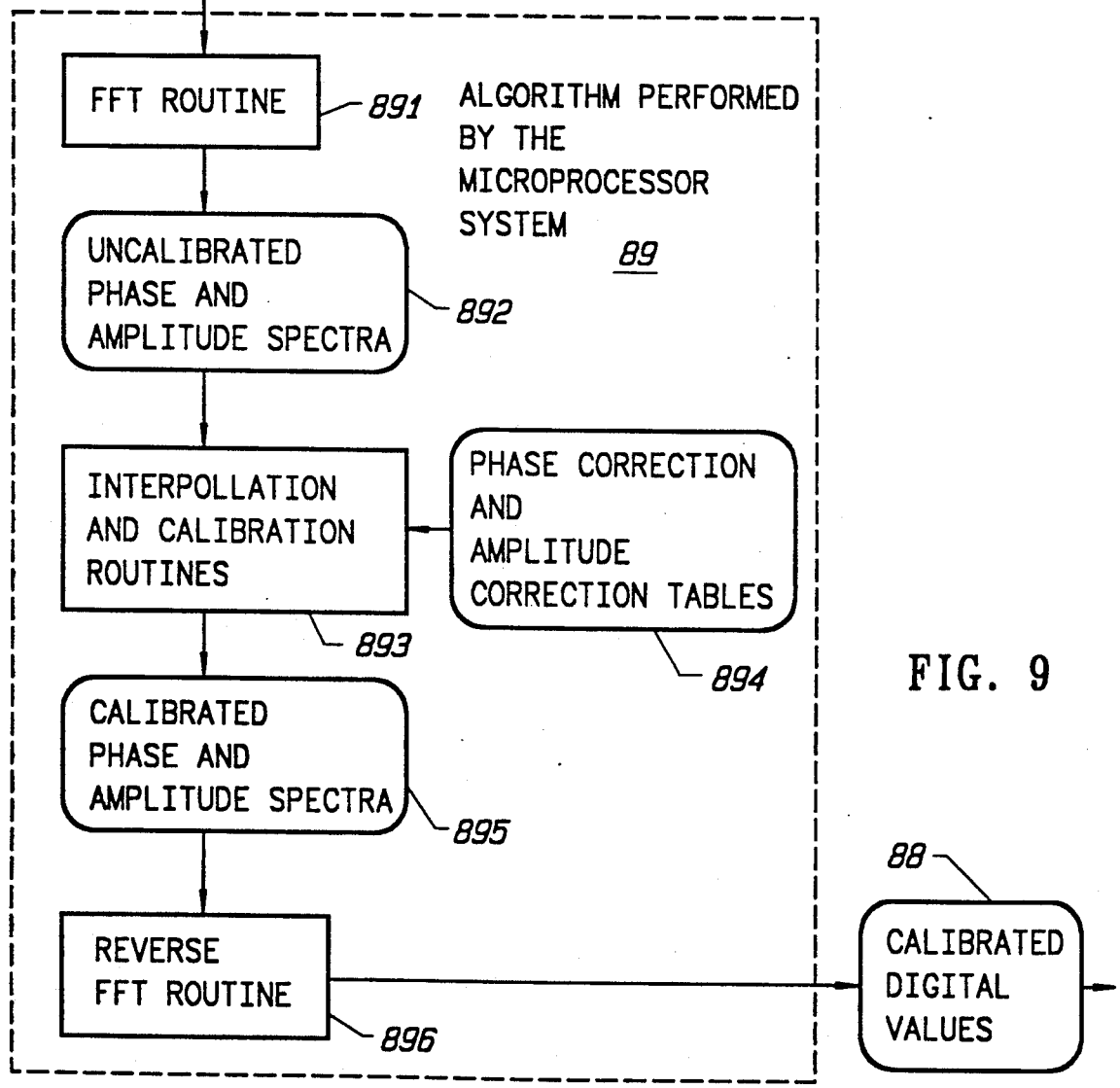
FIG. 9 shows a more detailed block diagram of the micro processor system contained in FIG. 8.

In FIG. 9, each of the tables 71 and 72 are stored in a digital form in a portion of memory of the microprocessor system 87. The microprocessor system 87 samples the output of the A/D converter 85 at regular intervals to construct a set of uncalibrated digital values 86 of the waveshape. The uncalibrated digital values 86 may have been distorted by the transducer 82, the amplifier 83, the filter 84, or the A/D converter 85. The microprocessor 87 employs an algorithm 89 to reconstruct a digital representation of the original undistorted waveform. The microprocessor uses a fast Fourier transform (FFT) routine 891 to convert the amplitude vs. time waveshape data 86 into amplitude vs. frequency and phase vs. frequency spectra 892. Any of the Fourier Transform techniques which are well known in the art, including hardware implementations, may be employed. Using the Amplitude Correction Tables and Phase Correction Tables 894 (which are the collections of table 71 and 72 of FIG. 7), the microprocessor uses conventional interpolation and calibration routines 893 to determine the Calibrated Phase and Amplitude spectra 895. These spectra 895 are input to a reverse FFT routine 896, whose output is a calibrated digital value 88.

Figure 10:
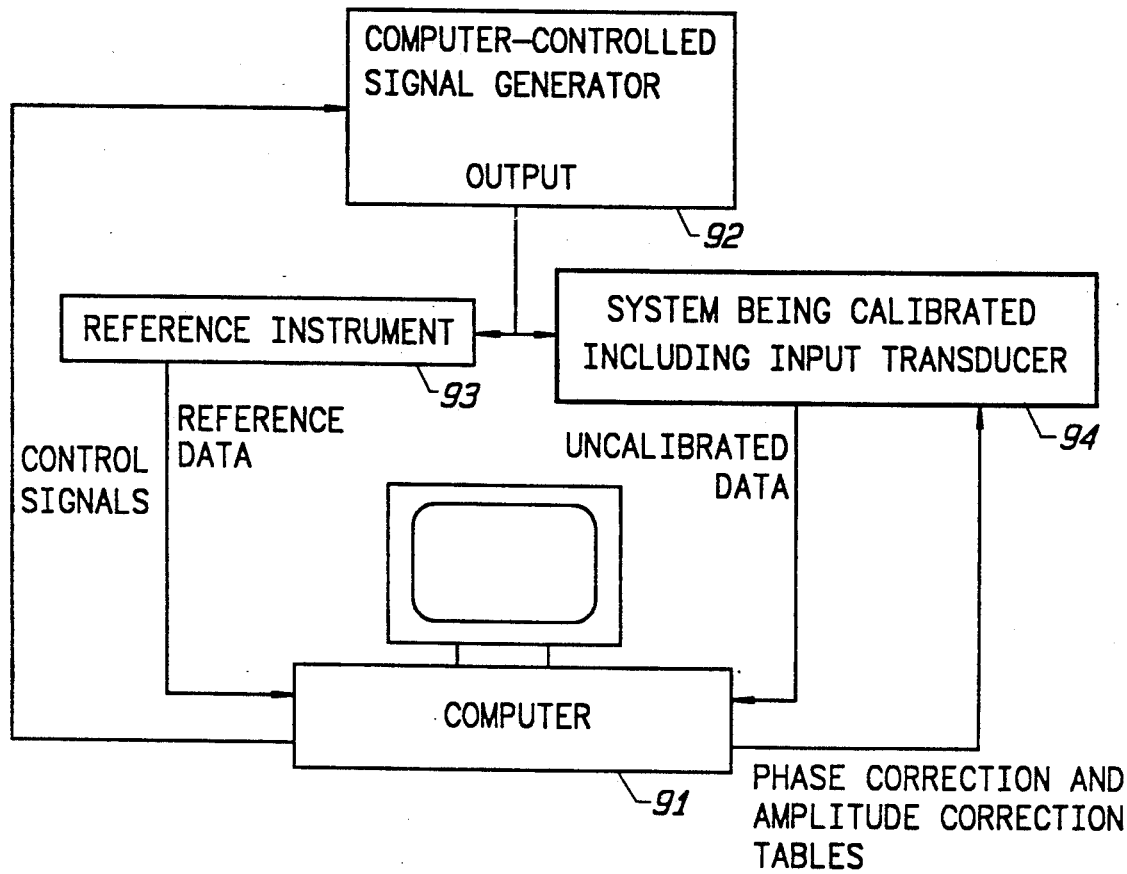
FIG. 10 shows a block diagram of an apparatus which generates the calibration correction tables shown in FIG. 7 for systems which have a digital output.

The apparatus shown in FIG. 10 generates the Amplitude Correction Tables and Phase Correction Tables. A computer 91 instructs a computer-controlled signal generator 92 to provide a sinusoidal signal at a particular amplitude and frequency to the transducer of the system being calibrated 94 and to a reference instrument 93. The computer examines the uncalibrated output data from the system being calibrated 94 and compares it to the reference data from the reference instrument 93, then constructs a single point on an Amplitude Correction Table and a single point on a Phase Correction Table. The computer repeats this process for the complete range of amplitudes and frequencies of interest. The computer then communicates the resulting Phase Correction Tables and Amplitude Correction Tables to the system being calibrated 94, which stores them in its digital memory. The entire calibration process may be repeated with the system being calibrated 94 employing its new Amplitude Correction Tables and Phase Correction Tables. The computer 91 can then verify that the calibration brought the system within specification.

This calibration process is primarily of interest when a sinusoidal signal at a particular frequency and amplitude can be passed through the transducer, amplifier, filter, and A/D converter and emerge as a sinusoidal signal at the same frequency but with a different amplitude and phase shift. The computer 91 can check for this characteristic during the calibration process by examining an amplitude vs. frequency spectrum from the system being calibrated for each sinusoidal input signal.

It will be noted that the reference instrument 93 is employed as a transfer standard, and that the accuracy of the resulting calibration is limited only by the accuracy of the reference instrument 93, the resolution and noise floor of the A/D conversion process including transducer, amplifier, and filter, and the amount of available storage for storing the Correction Tables.

Alternate Embodiments

Figure 11:
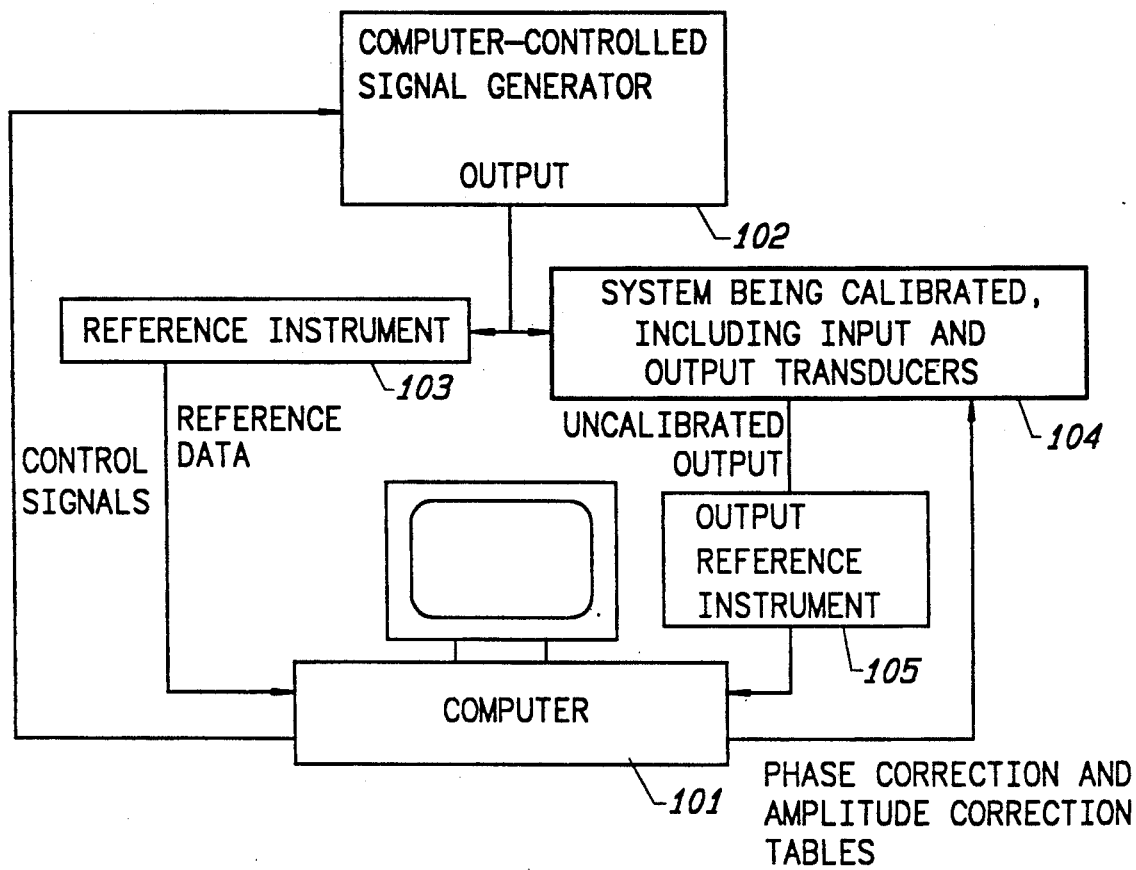
FIG. 11 shows a block diagram of an apparatus which generates the calibration correction tables shown in FIG. 7 for systems which have a transducer output.

The system being calibrated 104 may incorporate an output transducer, such as an audio speaker, in addition to or in place of an input transducer. In this case, the characteristics of the output transducer may be incorporated in the calibration process using the apparatus shown in FIG. 11 to construct the Amplitude Correction tables and Phase Correction Tables. The operation is identical to that of the apparatus shown in FIG. 9, except that the physical signal generated by the output transducer of the system being calibrated is applied to an output reference instrument 105, which converts the physical signal to a calibrated digital signal. This output reference instrument 105 is also used as a transfer standard, and the accuracy of the calibration process is limited by its accuracy.

What is claimed is:

1. A method for calibrating a measuring system comprising the steps of:
   (a) storing a plurality of correction tables with respect to a range of frequencies in the frequency domain each table having a plurality of values for a given parameter;
   (b) sensing a time domain signal;
   (c) transforming the time domain signal into a plurality of uncalibrated frequency domain signals;
   (d) comparing each of the uncalibrated frequency domain signals to an appropriate value for a corresponding one of the plurality of corrections tables for forming a plurality of calibration signals;
   (e) operating on each of the uncalibrated frequency domain signals with an appropriate calibration signal to form a plurality of calibrated frequency domain signals; and
   (f) converting the plurality of calibrated frequency domain signals into a calibrated time domain signal.

2. The method according to claim 1 wherein the step of transforming comprises the steps of first performing an analog to digital conversion and then performing a Fourier transform.

3. The method according to claim 2 wherein the Fourier transform is a fast Fourier transform.

4. The method according to claim 1 wherein the step of converting comprises the steps of first performing an inverse Fourier transform and then performing a digital to analog conversion.

5. The method according to claim 1 wherein the plurality of frequency domain correction tables includes amplitude correction tables for a plurality of frequencies and phase correction tables for a plurality of frequencies.

6. The method according to claim 5 wherein the step of comparing each of the uncalibrated frequency domain signals to each appropriate one of the plurality of correction tables includes comparing each of the uncalibrated frequency domain signals to an amplitude to frequency correction table and to a phase to a frequency correction table.

7. A method for calibrating a measuring system comprising the steps of:
   (a) storing a plurality of amplitude correction tables with respect to a range of frequencies in the frequency domain for a plurality of frequencies;
   (b) storing a plurality of phase correction tables with respect to a range of frequencies in the frequency domain for a plurality of frequencies;
   (c) measuring a physical value;
   (d) forming a measured signal from said physical value;
   (e) converting said measured signal to form an uncalibrated digital signal;
   (f) performing a Fourier transform on said uncalibrated digital signal to form a plurality of uncalibrated frequency domain signals;
   (g) comparing each of said frequency domain signals to an appropriate one of said plurality of amplitude correction tables and to one of said plurality of phase correction tables to form a plurality of calibrated frequency domain signals;
   (h) performing a reverse Fourier transform to said calibrated frequency domain signals to form a calibrated digital signal.

8. An apparatus for calibrating a measuring system comprising:
   (a) means for storing a plurality of correction tables with respect to a range of frequencies in the frequency domain each table having a plurality of values for a given parameter;
   (b) means for sensing a time domain signal;
   (c) means for transforming the time domain signal into a plurality of uncalibrated frequency domain signals;
   (d) means for comparing each of the uncalibrated frequency domain signals to an appropriate value for a corresponding one of the plurality of correction tables for forming a plurality of calibration signals;
   (e) means for operating on each of the uncalibrated frequency domain signals with an appropriate calibration signal to form a plurality of calibrated frequency domain signals; and
   (f) means for converting the plurality of calibrated frequency domain signals into a calibrated time domain signal.

9. The apparatus according to claim 8 wherein the means for transforming comprises an analog to digital converter and a Fourier transformer.

10. The apparatus according to claim 9 wherein the Fourier transformer is a fast Fourier transformer.

11. The apparatus according to claim 8 wherein the means for converting comprises an inverse Fourier transformer and a digital to analog converter.

12. The apparatus according to claim 8 wherein the plurality of frequency domain correction tables includes amplitude correction tables for a plurality of frequencies and phase correction tables for a plurality of frequencies.

13. The apparatus according to claim 12 wherein the means for comparing each of the uncalibrated frequency domain signals to each appropriate one of the plurality of correction tables includes means for comparing each of the uncalibrated frequency domain signals to an amplitude to frequency correction table and to a phase to a frequency correction table.

14. An apparatus for calibrating a measuring system comprising:
   (a) means for storing a plurality of amplitude correction tables with respect to a range of frequencies in the frequency domain for a plurality of frequencies;
   (b) means for storing a plurality of phase correction tables with respect to a range of frequencies in the frequency domain for a plurality of frequencies;
   (c) means for measuring a physical value;
   (d) means for forming a measured signal from said physical value;
   (e) means for converting said measured signal to form an uncalibrated digital signal;
   (f) means for performing a Fourier transform on said uncalibrated digital signal to form a plurality of uncalibrated frequency domain signals;
   (g) means for comparing each of said frequency domain signals to an appropriate one of said plurality of amplitude to frequency correction tables and to one of said plurality of phase to frequency correction tables to form a plurality of calibrated frequency domain signals;
   (h) means for performing a reverse Fourier transform to said calibrated frequency domain signals to form a calibrated digital signal.

* * * * *

UNITED STATES PATENT AND TRADEMARK OFFICE
CERTIFICATE OF CORRECTION

PATENT NO. : 5,014,229
DATED : May 7, 1991
INVENTOR(S) : Alexander McEachern

It is certified that error appears in the above - identified patent and that said Letters Patent is hereby corrected as shown below:

On the front page, in the inventor's name:
    Under item [19] and in item [75], delete "Mofachern"

and replace with --McEachern--.

Signed and Sealed this

Twenty-sixth Day of November, 1991

Attest:

HARRY F. MANBECK, JR.

*Attesting Officer*  *Commissioner of Patents and Trademarks*